United States Patent [19]

Rode et al.

[11] 3,950,195

[45] Apr. 13, 1976

[54] LPE TECHNIQUE FOR REDUCING EDGE GROWTH

[75] Inventors: Daniel Leon Rode, Murray Hill; Norman Edwin Schumaker, Warren, both of N.J.

[73] Assignee: Bell Telephone Laboratories, Incorporated, Murray Hill, N.J.

[22] Filed: Feb. 21, 1975

[21] Appl. No.: 551,598

[52] U.S. Cl. .......... 148/171; 148/172; 252/62.3 GA; 156/622
[51] Int. Cl.² .......................................... H01L 7/38
[58] Field of Search .................. 148/171, 172, 173; 156/622; 252/62.3 GA

[56] References Cited
UNITED STATES PATENTS
3,741,825    6/1973    Lockwood et al. ................. 148/171

OTHER PUBLICATIONS
J. Crystal Growth, Vol. 20, pp. 13–23 (1973).
Abst. 68, Electrochem. Soc. Mtg., May 12–17, 1974.
J. Crystal Growth, Vol. 27, pp. 49–61 (1974).
J. Crystal Growth, Vol. 27, pp. 1–5 (1974).

*Primary Examiner*—G. Ozaki
*Attorney, Agent, or Firm*—M. J. Urbano

[57]  ABSTRACT

Described is a liquid phase epitaxy technique using conventional slider apparatus in which, after heating the source solution to saturation, the solution temperature is rapidly reduced so that supersaturation takes place but heterogeneous nucleation does not. The solution is allowed to reach convective equilibrium and only then is brought into contact with the substrate. Once in contact, the temperature is maintained constant so that convection currents in the solution are substantially reduced. This technique has several advantages: reduced edge growth, increased usable wafer area, and reduced wipe-off problems.

10 Claims, No Drawings

LPE TECHNIQUE FOR REDUCING EDGE GROWTH

BACKGROUND OF THE INVENTION

This invention relates to epitaxial growth processes and, more particularly, to liquid phase epitaxy (LPE) using slider apparatus.

In the prior art, horizontal growth of GaAs is commonly accomplished using a graphite slider apparatus and ramp-cooling techniques. U.S. Pat. No. 3,741,825 granted to H. F. Lockwood and M. Ettenberg on June 16, 1973 is illustrative of both the apparatus and technique. Briefly, the apparatus comprises a solution holder or boat having a plurality of tandem wells for carrying source solutions. A slider having at least two recesses in tandem, one for carrying a substrate and another for carrying a saturation seed, is inserted in a channel which extends horizontally through the boat and beneath the wells. The saturation seed precedes the substrate under each solution. Thus, in operation the boat is loaded with appropriate source solutions (e.g., Ga solutions of GaAs), and the slider is loaded with the substrate and saturation seed. The apparatus is then placed in a quartz tube within a furnace. After suitable flushing of the ambient with hydrogen, the furnace temperature is raised to a temperature at which the source solutions are saturated (about 800°C for GaAs). A controlled cooling program is then instituted and the slider is moved until the saturation seed is located under the first well to establish local liquidus equilibrium. Then the slider is again moved until the saturation seed is under the second well and the substrate is under the first well. Epitaxial growth takes place on the substrate at a rate determined by the cooling rate. Simultaneously the saturation seed establishes local liquidus equilibrium at the bottom of the second solution. Repetition of these steps results in the growth of multilayered structures such as GaAs-AlGaAs double heterostructure junction lasers.

One problem consistently met in this prior art LPE technique is excessive edge growth. That is, the epitaxial layers grow at a faster rate near the edges of th substrate or wafer than at the interior portions thereof. In this regard the term edge need not be the actual outer edge of the substrate. Because the substrate is typically larger than the bottom of the source solution wells, the edge is commonly the region underlying or near to the interior vertical walls of the well. Generally, the amount of edge growth is a function of such parameters as the cooling rate and the boat design. Thus, higher cooling rates and thinner walled boats (often used to maintain close thermal contact with the furnace) both tend to exacerbate the problem. From a quantitative standpoint, thickness profiles of epitaxial layers commonly exhibit thicknesses at the edges which exceed that in central portions of the wafer by an order of magnitude. For example, in one case of a four-layer GaAs-AlGaAs double heterostructure, the thickness of the central portio was about 3.6 $\mu$m whereas the peak thickness at the edges was about 58.4 $\mu$m. In other similar cases the edges were as high as 170 $\mu$m.

Excessive edge growth presents two significant difficulties in the prior art ramp-cooled LPE technique. First, because the edge growth extends inwardly on the wafer, the usable area of the wafer for making devices is reduced. While the per cent of usable area lost depends on the size of the wells used, in a typical example the wells are 12 mm square and the edge growth occupies a 1.5 mm band around the periphery. Thus, the usable area is reduced from 144 mm$^2$ to about 81 mm$^2$, a 44 percent reduction. Secondly, it is difficult to wipe off the source solution over such an irregularly shaped edge. Moreover, when the slider is spaced close to the bottom of the wells to improve wipe-off, the high edges of the wafer scratch graphite particles from the boat. These particles, as well as broken-off pieces of the edge growth, disrupt subsequent layer growth in the places where they lie.

Maintenance of nearly complete wipe-off (greater than 95 percent of the growth area) is ordinarily achieved with great difficulty. Satisfactory wipe-off is usually a compromise between nearly complete wipe-off achieved at close boat-to-slider spacings resulting in many scratches and pits on the layer surface and not-so-complete wipe-off (about 60 percent of the growth area) with fewer scratches and pits achieved at larger boat-to-slider spacings. So, one empirically adjusts the boat-to-slider spacing very carefully to a certain value for each particular LPE system.

SUMMARY OF THE INVENTION

It has been found in the growth of GaAs and AlGaAs layers from Ga solutions that the prior art ramp-cooled LPE technique leads to excessive edge growth because of the relatively high radiant heat loss from graphite compared to liquid Ga during the cooling cycle, e.g., uniform ramp-cooling from 778°C at a rate of 0.1° C/min. The resulting nonuniform heat loss causes horizontal temperature gradients near the interface between the Ga solution and the graphite boat which in turn, by thermal expansion of the solution and by the gravitational field, leads to attached convection cells near the edges of the solution.

It is important to note that the Ga solution stably resists convective flow near the central, vertical core of the solution because of the downward flow of heat in this region. The central heat flux is directed downward because of the relatively small heat loss from the shiny Ga surface above the solution compared to conductive heat loss through the substrate and graphite slider below the solution. This configuration leads to small convective cells (2 to 3 mm thick) "attached" to the walls of the wells.

Convective transport of solute As from the upper reaches of the solution overcomes the slow diffusive transport of As. We estimate in one case the solute velocity due to diffusion as 200 $\mu$m/min whereas the convection velocity appears to be about 2 mm/min. Hence, the growth rate is greatly enhanced near the interface between the solution and the graphite boat. Accordingly, we devised the LPE technique using conventional slider apparatus in which edge growth has been reduced by a factor of about ten, thereby increasing the usable wafer area and alleviating wipe-off problems.

We recognized that since it is possible to maintain tens-of-degrees of supersaturation in GaAs-AlGaAs solutions for times comparable to the total growth time, and since dynamic temperature gradients rather than static temperature gradients generate the convection cells, we could step-cool the source solutions before sliding the saturation seed and substrate under the solutions. Then, we could perform sequential slide and growth operations at a substantially constant temperature after waiting for temperature gradients to die out.

Experiments discussed hereinafter verified this hypothesis.

In accordance with an illustrative embodiment of our invention, an LPE technique includes the following steps: (a) placing growth (source) solutions into the wells of the boat and a substrate into the recess of the slider; (b) in a controlled atmosphere, heating the solutions and substrate until the solutions are saturated; (c) rapidly cooling the solutions and substrate to a temperature at which the solutions are supersaturated but heterogeneous nucleation in the solutions does not occur; heterogeneous nucleation is defined as precipitation on impurities in the source solution, as contrasted with spontaneous precipitation which assumes a pure solution; (d) before bringing the first solution and substrate into contact with one another, allowing sufficient time to elapse for substantial convective equilibrium to be established in the solutions; (e) moving the boat and slider relative to one another so that the substrate is positioned under the first solution and an epitaxial layer is grown on the substrate; (f) maintaining substantially constant the temperature of the solutions and substrate; and (g) moving the boat and slider relative to one another to remove the first solution and layer from contact with one another. Of course, where multilayered growth is desired, after step (g) the slider would be moved to place the substrate under a second solution. Moreover, as in the prior art, a saturation seed is preferably utilized to establish local liquidus equilibrium under each solution prior to bringing it into contact with the substrate.

DETAILED DESCRIPTION

Our invention, together with its various features and advantages can be readily understood from the following more detailed description and illustrative examples.

As discussed above, excessive edge growth is a result of dynamically induced temperature gradients as opposed to longer range nonuniformities in layer thickness caused by static temperature gradients. Thus, considerations of heat flow suggest that the edge growth problem can be alleviated by isothermal growth. Consider specifically growth of GaAs or AlGaAs layers from Ga solutions. Since As diffuses rather slowly through Ga solutions, we propose to step-cool the solutions to produce supersaturation (but not heterogeneous nucleation) before bringing the substrate and solution into contact with one another. Then, after waiting a suitable length of time for thermal and convective equilibrium to occur, the sliding and growth steps are performed at a constant temperature.

We estimate the time required for thermal and convective equilibrium to be established from the thermal diffusivity (0.31cm²/sec) and viscous damping time of Ga at 778°C, a typical starting temperature for LPE growth. Thermal equilibration times for distances in the neighborhood of 6 mm (half the lateral dimension of a typical solution) are approximately $(0.6)^2/0.31 = 1.2$ sec. The viscous damping time $\tau_c$ for a 3 mm convection cell, corresponding to twice the typical lateral dimension of the edge growth region when ramp-cooling is used, is of the order of $\tau_c \approx 1^2/\gamma$ where $1 = 3$ mm and $\gamma$ is the kinematic viscosity (0.12 mm²/sec) at 778°C. We thus obtain $\tau_c \approx 75$ sec. Clearly, therefore, thermal equilibration prevails quickly compared to convective equilibration.

In general, the foregoing techniques can be applied to the growth of GaAs-AlGaAs layers at growth temperatures in the range of about 750° to 850°C. Within this range, the temperature decrement to produce supersaturation should not be greater than about 10°C, otherwise nucleation on impurities in the growth solution will rapidly occur, but should be greater than about 2°C otherwise the waiting period before growth takes place becomes so long that heterogeneous nucleation will again occur. Also within this range, the waiting period for allowing convective equilibrium to take place should exceed about 75 sec, as calculated above for 778°C. Inasmuch as the kinematic viscosity is a slow function of temperature in this range, $\tau_c$ does not change very much from one end of the range to the other.

Based on the above results, we used a conventional graphite boat and slider apparatus and the following growth schedule for a sample designated LF 438.

EXAMPLE I: LF 438

Into the two recesses of the slider we placed an undoped GaAs saturation seed and a <100> oriented, n-type GaAs substrate doped with Si the about $2 \times 10^{18}$. Both the seed and substrate were obtained from commercial sources. The solution holder or boat had five wells into which the following constituents were loaded: portion

| Well No. | Ga (gm) | GaAs (mg) | Te (mg) | Ge (mg) | Al (mg) |
|---|---|---|---|---|---|
| 1 | 4.0 | 125.9 | 150 | | 1.73 |
| 2 | 4.1 | 154.7 | | 10.3 | |
| 3 | 4.0 | 124.5 | | 26.1 | 1.78 |
| 4 | 4.1 | 155.5 | | 49.9 | |
| 5 | 4.1 | 156.2 | | 49.2 | |

Note the Al, GaAs and dopants were not added until after the boat had been loaded into the quartz tube and flushed with hydrogen, a well-known procedure. The solutions were then heated to saturation at about 776.8°C and subsequently rapidly cooled by 5°C at a relatively rapid rate of 0.5°C/min. The furnace temperature was then maintained substantially constant, at about 772°C with a deviation of about ± 0.02°C. The 5°C decrement was large enough to supersaturate the solutions, but small enough to prevent heterogeneous nucleation. The solutions were held supersaturated for about 10 mins before commencing the sequential sliding operation at nearly constant temperature. The 10 min detention period allowed convective equilibrium to be nearly completely established. Following this period, the slider was step-wise moved to position the saturation seed and substrate sequentially under the solutions to grow a four-layer double heterostructure (DH) described below:

| Well No. | Layer Composition | Layer Thickness | Growth Time |
|---|---|---|---|
| — | $n^+$ — GaAs:Si (sub) | 13 mil | — |
| 1 | n — $Al_xGa_{1-x}As$ | 0.54 μm | 10 min |
| 2 | p — GaAs | 0.22 μm | 1 min |
| 3 | p — $Al_yGa_{1-y}As$ | 0.51 μm | 10 min |
| 4 | p — GaAs | 0.20 μm | 5 min |
| 5 | — | — | 0 min |

In this case the aluminum mole fraction in layers 1 and 3 was about the same: $x \approx y = 0.24$.

Note that no layer was grown from the GaAs solution in well 5. We observed that when using prior art LPE rampcooling edge growth tends to be especially pronounced at the leading edge of the last grown layer. This effect we found can be substantially reduced by shielding the last solution (in well 4) from heat loss by filling an additional well (5) beyond the (ordinarily) last one with a "dummy" solution substantially identical to that used to grow the last layer. Following growth of the last layer from the penultimate solution (in well 4), the substrate was passed under the dummy solution without delay as its only purpose was heat retention rather than layer growth. This approach allowed more complete solution wipe-off in most cases.

Talysurf (trademark of Rank Precision, Inc.) height profiles were taken of the heterostructure wafer near positions of maximum edge growth. The average total thickness of the central portion of the wafer was about 1.65 μm. The edge growth typically ranged from about 2.8 to 3.4 μm and occupied a band of only about 0.1 mm. It is apparent therefore that, compared to prior art ramp-cooled techniques, edge growth was reduced by more than an order of magnitude and the usable wafer area was decreased from $12 \times 12 = 144$ mm² to about 142 mm², only a 1.4 percent reduction. Essentially complete solution wipe-off, with few scratches and pits, was easily obtained during sliding operations in which the slider-to-boat clearance was about 150 μm.

One problem, not related to edge growth or wipeoff, remained. We observed that the p-GaAs layer grown from the solution in well 2 was not continuous. That is, at some locations the n-AlGaAs layer and the p-AlGaAs contacted one another through "holes" in the p-GaAs layer. Upon reflection we concluded that the cause of this problem was that the bottom of the solution in well 3 had not reached local liquidus equilibrium; i.e., that solution, being too highly supersaturated, and of AlGaAs composition rather than GaAs composition, dissolved portions of the p-GaAs after the next sliding operation brought them into contact. The reason for excessive supersaturation of the solution in well 3 stems from the fact that the p-GaAs layer was grown so thin (a common DH configuration) that its growth time, and thus the time which the saturation seed was under well 3, was so short (about 1 min) that local equilibration of the solution in well 3 did not take place.

We resolved this difficulty by simply leaving well 3 empty and placing source solutions in wells 1, 2, 4 and 5 only. Note, because the boat had only five wells a dummy solution was not used. The following example of wafer LF 444 is illustrative of this modified technique.

EXAMPLE II: LF 444

In this example we followed the basic procedure of Example I, with however, several modifications: well 3 was empty; no dummy solution was used because the boat had only five wells; and the smallest cooling rate available from our equipment (0.03°C/min) was used. Because the constant temperature control used in Example I allowed variations of ±0.02° to ±.03°C/min, this very small cooling rate in effect produced a "constant" temperature in the sense that growth occurred from the supersaturated nature of the solutions and not from the cooling in any significant amount. We loaded the following solutions into the boat:

| Well No. | Ga (gm) | GaAs (mg) | Te (mg) | Ge (mg) | Al (mg) |
|---|---|---|---|---|---|
| 1 | 4.0 | 117.8 | 135 | | 1.78 |
| 2 | 4.0 | 146.9 | | 10.5 | |
| 3 | empty | — | — | — | — |
| 4 | 4.0 | 116.5 | | 25.6 | 1.75 |
| 5 | 4.0 | 145.4 | | 50.7 | |

In this case, while the p-GaAs layer was being grown from the solution in well 2, a step which lasted 1 min approximately, the saturation seed was under the empty well 3. Next, the slider was moved to a no-growth position: the substrate was under empty well 3 and the saturation seed was under well 4. This position was maintained for about 15 min to achieve local liquidus equilibrium of the solution in well 4. Of course no growth on the substrate occurred during this period. When equilibrium was complete, the slider was again moved to place the substrate under well 4 and the saturation seed under well 5. The resulting heterostructure comprised the following:

| Well No. | Layer Composition | Layer Thickness | Growth Time |
|---|---|---|---|
| — | n⁺-GaAs:Si(sub) | 13 mil | — |
| 1 | N-Al$_x$Ga$_{1-x}$As | 0.88μm | 10 min |
| 2 | p-GaAs | 0.33 μm | 1 min |
| 3 | — | — | 15 min |
| 4 | p-Al$_y$Ga$_{1-y}$As | 0.67 μm | 20 min |
| 5 | p-GaAs | 0.50 μm | 15 min |

In this case, the p-GaAs layer grown from well 2 was continuous. Moreover, Talysurf height profiles of the wafer, as with wafer LF 438, exhibited edge growth reduced by an order of magnitude, increased usable wafer area, and virtually complete solution wipe-off.

An alternative solution to the problem of discontinuous thin layers is to use at least two saturation seeds both of which precede the substrate under each solution. In this manner, the solution in well 3 of Example I, for instance, would be in contact with a saturation seed during the growth of both the first and second layers, thus allowing adequate time to elapse to bring the solution in well 3 (Example I) to local liquidus equilibrium. In the limit, of course, a separate saturation seed may be used for each solution. We have found the use of multiple saturation seeds to be effective in preventing discontinuous growth and may be preferred where exposure of the substrate (and the freshly grown layer thereon) under the empty well of Example II is undesirable.

It is to be understood that the above described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, while our invention has been described with specific reference to the LPE growth of GaAs and AlGaAs layers, it is equally applicable to other Group III (a)-V(a) materials, such as GaP, GaAsP, InP, InGaAs, and especially AlGaAsP.

EXAMPLE III: LF 451 and 452

The technique of Example II was modified to the extent that an n-GaAs:Si substrate oriented along the <511> plane was used and the growth time for the AlGaAs layers was increased to make heterostructures more suitable for use as DH lasers. In addition, about 90 mg of GaP was added to the solutions in wells 1 and 4. Otherwise the composition of the four growth solutions was substantially the same as that of Example II. The resulting DH wafers comprised an n-GaAs substrate on which were sequentially grown the following layers: an n-$Al_xGa_{1-x}As_{1-y}P_y$ layer about 1.0 μm thick; a p-GaAs layer (active region) about 0.3 μm thick; a p-$Al_xGa_{1-x}As_{1-y}P_y$ layer about 1.0 μm thick; and a p-GaAs layer about 0.8 μm thick. In these structures x = 0.24 and y = 0.0064. When the wafers were cut and cleaved into individual laser diodes, electrical contacts were formed and the diodes were mounted on suitable heat sinks. C.W. operation at room temperature was observed in twenty diodes (10 randomly selected from each wafer).

What is claimed is:

1. A liquid phase epitaxial growth technique comprising the steps of:
  a. in a controlled atmosphere, heating a source solution and a substrate until said solution is saturated;
  b. rapidly cooling said solution and substrate to a temperature at which said solution is supersaturated but heterogeneous nucleation in said solution does not occur;
  c. before bringing said solution and substrate into contact with one another, allowing sufficient time to elapse for convective equilibrium to be established in said solution;
  d. bringing said solution and substrate into contact with one another for a sufficient time period to allow an epitaxial layer of a desired thickness to be grown on said substrate; and
  e. during steps (c) and (d), maintaining substantially constant the temperature of said solution and substrate.

2. A liquid phase epitaxial growth technique used in conjunction with growth apparatus which includes a solution holder having at least one solution well therein and a substrate holder havng at least one recess therein, said holders being movable relative to one another to bring said at least one recess and said at least one well into substantial registration with one another, said technique comprising the steps of:
  a. placing a source solution into said at least one well and a substrate into said at least one recess;
  b. in a controlled atmosphere, heating said solution and substrate until said solution is saturated;
  c. rapidly cooling said solution and substrate to a temperature at which said solution is supersaturated but heterogeneous nucleation in said solution does not occur;
  d. before bringing said solution and substrate into contact with one another, allowing sufficient time to elapse for convective equilibrium to be established in said solution;
  e. moving said holders relative to one another to bring said solution and substrate into contact with one another so that an epitaxial layer is grown on said substrate;
  f. during steps (d) and (e), maintaining substantially constant the temperature of said solution and substrate so that convection currents in said solution are substantially reduced; and
  g. moving said holders relative to one another to remove said solution and layer from contact with one another.

3. The technique of claim 2 wherein said solution holder has a plurality of solution wells in tandem and including the steps of:
  placing source solutions in a plurality of said wells; and
  moving said holders relative to one another in stepwise fashion so that said substrate is brought into contact with each of said solutions sequentially, thereby to grow a plurality of epitaxial layers on said substrate.

4. The technique of claim 3 wherein said holder includes an additional well beyond the last well used to grow the last epitaxial layer on said substrate and including the steps of:
  placing a solution in said additional well effective to reduce radiant heat loss from the solution in said last well; and
  after the growth of said last layer moving the substrate quickly past said additional solution so that growth therefrom does not occur on said substrate.

5. The technique of claim 4 wherein the composition of said additional solution is substantially the same as that of said last solution.

6. The technique of claim 3 wherein said substrate holder has at least two recesses in tandem and including the steps of:
  placing a substrate in one of said recesses and a saturation seed in another of said recesses; and
  moving said holders relative to one another so that said saturation seed precedes said substrate into contact with each of said solutions for time periods effective to produce local liquidus equilibrium in each of said solutions.

7. The technique of claim 6 wherein the spacing between adjacent solutions, except for at least one pair, is uniform and substantially equal to the spacing between said recesses, and between said at least one pair there is a no-growth position at which said substrate is not in contact with any of said solutions, and including the steps of
  moving said holders relative to one another so that said substrate is in contact with a first solution of said pair while said saturation seed is located at said no-growth position;
  growing a layer which is so thin that, if said seed were in contact with a second solution of said pair, the period of contact between said seed and second solution would be insufficient to produce local liquidus equilibrium in said second solution;
  moving said holders relative to one another so that said substrate is located at said no-growth position and said seed is in contact with said second solution for a time period sufficient to produce local liquidus equilibrium in said second solution;
  moving said holders relative to one another so that said substrate (with said thin layer thereon) is in contact with said second solution for a time period effective to grow another epitaxial layer on said thin layer without significantly dissolving portions of said thin layer.

8. The technique of claim 2, wherein said solutions comprise Group III(a)-V(a) compounds.

9. The technique of claim 8 wherein said solutions comprise Ga solutions effective to grow layers having compositions selected from the group consisting of GaAs, AlGaAs and AlGaAsP.

10. The technique of claim 9 wherein:
   in step (b) said heating produces a temperature in the range of about 750° to 850°C;
   in step (c) said cooling produces a temperature decrement in the range of about 2° to 10°C; and
   in step (d) the time elapsed exceeds about 75 seconds.

* * * * *

UNITED STATES PATENT AND TRADEMARK OFFICE
CERTIFICATE OF CORRECTION

PATENT NO. : 3,950,195
DATED : April 13, 1976
INVENTOR(S) : Daniel L. Rode and Norman E. Schumaker It is certified that error appears in the above-identified patent and that said Letters Patent are hereby corrected as shown below:

Column 1, line 60, "portio" should be --portion--.

Column 3, line 62, change "$1^2/\gamma$" to --$1^2/\nu$--.

Column 3, line 63, change "$\gamma$" to --$\nu$--.

Column 4, line 26, delete "portion".

Column 6, line 27, after "1" change "$N-Al_xGa_{1-x}As$" to --$n-Al_xGa_{1-x}As$--.

Signed and Sealed this

Twenty-seventh Day of July 1976

[SEAL]

Attest:

RUTH C. MASON
*Attesting Officer*

C. MARSHALL DANN
*Commissioner of Patents and Trademarks*